(12) United States Patent
Wyszynski

(10) Patent No.: US 6,756,830 B1
(45) Date of Patent: Jun. 29, 2004

(54) CHARGE PUMP FOR A CURRENT SWITCH

(75) Inventor: Adam S. Wyszynski, Little Elm, TX (US)

(73) Assignees: Sharp Corporation, Osaka (JP); Rivlan, Inc., Little Elm, TX (US)

( * ) Notice: Subject to any disclaimer, the term of this patent is extended or adjusted under 35 U.S.C. 154(b) by 0 days.

(21) Appl. No.: 10/341,444

(22) Filed: Jan. 14, 2003

(51) Int. Cl.[7] .............................................. H03L 7/093
(52) U.S. Cl. ....................................... 327/157; 327/536
(58) Field of Search ................................ 327/536, 537, 327/157

(56) References Cited

U.S. PATENT DOCUMENTS 5,144,156 A * 9/1992 Kawasaki .................... 327/157
5,475,326 A * 12/1995 Masuda ....................... 327/157
6,064,243 A    5/2000 Matsuda et al. ............. 327/156
6,163,184 A * 12/2000 Larsson ....................... 327/156
2002/0041214 A1 * 4/2002 Ichimura ..................... 327/157

FOREIGN PATENT DOCUMENTS

JP          5129945        5/1993
JP         11027141        1/1999

* cited by examiner

*Primary Examiner*—Dinh T. Le
(74) *Attorney, Agent, or Firm*—Locke Liddell & Sapp LLP

(57) ABSTRACT

A charge pump for a current switch having at least one current source includes a current summation circuit for generating an output to the current switch. A first current source supplies a first current to the summation circuit. A second current source selectively supplies a second current to the summation circuit. A switch connects the second current source to the summation circuit, such that the current source of the current switch is proportional to the output of the summation circuit.

8 Claims, 1 Drawing Sheet

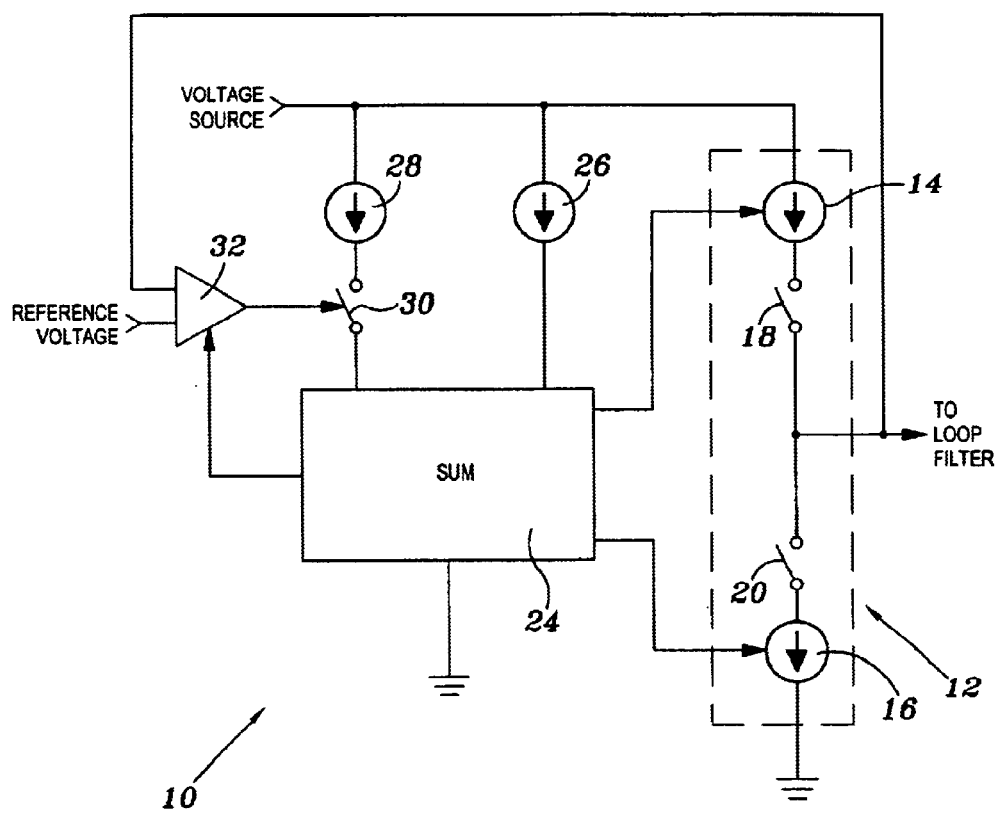

CHARGE PUMP FOR A CURRENT SWITCH

TECHNICAL FIELD OF THE INVENTION

The present invention relates to current switches, such as those utilized in phase-locked loops, and more particularly to a charge pump used with a current switch.

BACKGROUND OF THE INVENTION

Current switches are utilized to supply a constant current to a load circuit, such as a phase-locked loop. The input voltage of a phase-locked loop's voltage-controlled oscillator requires high precision, and when generating input voltage by charging or discharging capacitance proportional to phase difference, the current from a current source must be precisely supplied for charging/discharging purposes.

A need has developed for a charge pump for a current switch of a phase-lock loop circuit for accurately controlling the current sources In order to shorten the phase-locked loop loading, thereby substantially increasing the initial charging current and decreasing the charging current when the phase-locked loop controlling voltage reaches the loading (settled) range.

SUMMARY OF THE INVENTION

In accordance with the present invention, a charge pump for a current switch having at least one current source is provided. The charge pump includes a current summation circuit for generating an output to the current switch. A first current source supplies a first current to the summation circuit. A second current source selectively supplies a second current to the summation circuit. A switch connects the second current source to the summation circuit, such that the current source of the current switch is proportional to the output of the summation circuit.

BRIEF DESCRIPTION OF THE DRAWINGS

For a more complete understanding of the present invention and for further advantages thereof, reference is now made to the following Description of the Preferred Embodiments taken in conjunction with the accompanying Drawing which: is a block diagram of the present charge pump.

DESCRIPTION OF THE PREFERRED EMBODIMENTS

Referring to the Figure, the present charge pump circuit is illustrated and is generally identified by the numeral 10. Charge pump circuit 10 provides current to a current switch generally identified by the numeral 12. Current switch 12 includes current sources 14 and 16 which are controlled by switches 18 and 20, respectively. The output of current switch 12 is applied to a filter, such as for example a filter of a phase-lock loop circuit.

Charge pump circuit 10 includes a current summation circuit 24. Current summation circuit 24 receives current from a first current source 26 and a second current source 28. The application of current to summation circuit 24 from second current source 28 is controlled by a switch 30. The operation of switch 30 is controlled by the output of a comparator 32. Comparator 32 received a reference voltage at non-inverting input 40 and the output node voltage of current switch 12 at inverting input 42.

At least one of current sources 14 or 16 provides a current to the phase-lock loop circuit which is proportional to the current summed by summation circuit 24. Comparator 32 functions to compare the output node voltage of current switch 12 to a reference voltage. When the output node voltage is higher than the reference voltage, charge or discharge current is increased to current switch 12 by actuating switch 30 to add the current supplied by second current source 28 to summation circuit 24. When the output node voltage of current switch 12 is lower than the reference voltage, comparator 32 functions to actuate switch 30 to apply the current from second current source 28 to summation circuit 24. Voltage comparator 32 provides for hysteresis about the inverting voltage input 42.

Voltage comparator 32 may also receive an output 44 from summation circuit 24, such that voltage comparator 32 functions as a differential amplifier whose bias current is controlled by the current summed by summation circuit 24, so that comparator 32 has hysteresis about is inverting input 42.

Current switch 12 may comprise, for example, a current switch described in U.S. Pat. No. 6,064,243, whose description is incorporated herein by reference.

Other altercation and modification of the invention will likewise become apparent in those of ordinary skill in the art upon reading the present disclosure, and it is intended that the scope of the invention disclosed herein be limited only by the broadest interpretation of the appended claims to which the inventor is legally entitled.

I claim:

1. A charge pump for a current switch having at least one current source and an output node voltage, the charge pump comprising:

a current summation circuit for generating an output to the current switch;

a first current source for applying a first current to said summation circuit;

a second current source for selectively applying a second current to said summation circuit;

a switch for connecting said second current source to said summation circuit, such that the current source of the current switch is proportional to the output of the summation circuit; and a voltage comparator having an output connected to said switch and an input connected to the current switch output node voltage and a reference voltage; such that when the output node voltage is higher than the reference voltage, said switch is activated by said voltage comparator.

2. The charge pump of claim 1 wherein said voltage comparator includes hysteresis about an inverting input.

3. The charge pump of claim 1 wherein said voltage comparator comprises a differential amplifier having a bias current controlled by an output of said summation circuit, such that said differential amplifier has hysteresis about an inverting input.

4. A charge pump for a current switch having at least one current source and an output node voltage, the charge pump comprising:

a current summation circuit for generating an output to the current switch;

a first current source for applying a first current to said summation circuit;

a second current source for selectively applying a second current to said summation circuit;

a switch for connecting said second current source to said summation circuit, such that the current source of the current switch is proportional to the output of the summation circuit; and a voltage comparator having an output connected to said switch and an input connected to the current switch output node voltage and a reference voltage; such that when the output node voltage is lower than the reference voltage, said switch is activated by said voltage comparator.

5. The charge pump of claim 4 where in said voltage comparator includes hysteresis about an inverting input.

6. The charge pump of claim 4 wherein said voltage comparator comprises a differential amplifier having a bias current controlled by an output of said summation circuit such that said differential amplifier has hysteresis about an inverting input.

7. A method for dynamically changing charge pump current for increasing start time speed of the charge pump used with a current switch comprising:

providing a current summation circuit for generating an output to the current switch;

applying a first current to said summation circuit; and selectively applying a second current to the summation circuit such that the current of the current switch is proportional to the output of the summation circuit.

8. The method of claim 7 and further including:

providing a voltage comparator for controlling when the second current is applied to the summation circuit.

* * * * *